(12) United States Patent
Murata

(10) Patent No.: US 6,961,182 B2
(45) Date of Patent: Nov. 1, 2005

(54) MICRO ELECTRO MECHANICAL SYSTEMS DEVICE, METHOD OF MANUFACTURING THE SAME AND MICRO ELECTRO MECHANICAL SYSTEMS MODULE

(75) Inventor: Akihiro Murata, Hokuro (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/910,795

(22) Filed: Aug. 3, 2004

(65) Prior Publication Data

US 2005/0057331 A1 Mar. 17, 2005

(30) Foreign Application Priority Data

Aug. 4, 2003 (JP) ........................................ 2003-286269

(51) Int. Cl.⁷ .............................................. G02B 27/00
(52) U.S. Cl. ....................... 359/578; 359/900; 257/415; 356/454
(58) Field of Search ................................. 359/223, 224, 359/290, 291, 577, 578, 900; 200/181, 600; 356/454; 257/415

(56) References Cited

U.S. PATENT DOCUMENTS

| 5,627,396 A | * | 5/1997 | James et al. ................. 257/415 |
| 6,341,039 B1 | | 1/2002 | Flanders et al. ............ 359/578 |

* cited by examiner

Primary Examiner—Ramon M. Barrera
(74) Attorney, Agent, or Firm—Harness, Dickey & Pierce, P.L.C.

(57) ABSTRACT

A micro electro mechanical systems (MEMS) device includes a first substrate on which an electrode is formed, a movable substrate having at least a moving part and a periphery supporting member, and a second substrate having a concave portion. A space that includes a part of the concave portion is formed by jointing the first substrate, the movable substrate, and the second substrate together. The moving part inside the space moves when a voltage is applied between the electrode and the moving part through the periphery supporting member, and a part of the first substrate protrudes outside a side surface of the second substrate.

18 Claims, 3 Drawing Sheets

MICRO ELECTRO MECHANICAL SYSTEMS DEVICE, METHOD OF MANUFACTURING THE SAME AND MICRO ELECTRO MECHANICAL SYSTEMS MODULE

RELATED APPLICATIONS

This application claims priority to Japanese Patent Application No. 2003-286269 filed Aug. 4, 2003 which is hereby expressly incorporated by reference herein in its entirety.

BACKGROUND

1. Field of the Invention

The present invention relates to a Micro Electro Mechanical Systems (MEMS) device, a method of manufacturing the same and a MEMS module. More particularly, the invention relates to a MEMS device to which wire-bonding is easily applied when an electrode and the like are wired, a manufacturing method in which dicing can be carried out without impairing a driving member and the like in the MEMS device and a MEMS module that includes the MEMS device.

2. Description of the Related Art

According to a conventional method of manufacturing a semiconductor device, semiconductor devices formed on a silicon wafer are individually hewn out by dicing (cutting) with a diamond saw. Dicing is a cutting process in which the silicon wafer is attached on an adhesive sheet called a dicing sheet and the silicon wafer is cut with the diamond saw as water runs on the silicon wafer.

In a conventional method of forming a MEMS device, the silicon wafer on which the driving member (an actuator) and the like were formed is lined with a diamond pen. Then, silicon substrates that were going to be the MEMS devices are hewn out from the silicon wafer by cutting along the lines.

Some conventional tunable Fabry-Perot filters (one of the MEMS devices) have a moving part that moves when voltage is applied between a movable board that includes the moving part and the silicon substrate placed under the movable board (for example, see U.S. Pat. No. 6,341,039 (FIG. 1) stated below). A wiring providing a voltage to the movable board is coupled to the small side surface of the moving part. Wiring providing a voltage to the silicon substrate is directly coupled to the silicon substrate.

However, if the method of manufacturing a semiconductor device in which dicing is performed as running water flows directly on the silicon wafer is applied to the method of forming a MEMS device, there would be a problem. For example, the driving member (an actuator) formed on the silicon wafer, a mirror and the like are impaired and contaminated by chips.

Also, in the method of forming a MEMS device in which the silicon wafer is lined with a diamond pen and then the silicon substrates that are going to be the MEMS devices are hewn out by cutting the silicon wafer along the lines, the driving member is sometimes damaged by a mechanical shock given to the silicon wafer at the time of the cutting. Also, the driving member is contaminated by chips produced at the time of the cutting.

Further, in the Fabry-Perot filters (for example, see U.S. Pat. No. 6,341,039 (FIG. 1)), since the wiring providing a voltage to the movable board is coupled to the small side surface of the moving part, it is difficult to perform wire bonding. In a case that borosilicate glass or the like are used instead of silicon as the silicon board placed under the movable board and another electrode is provided on it, it is difficult to perform wire bonding to form a wiring providing a voltage to the electrode.

The present invention has been developed in consideration of the above-mentioned problems, and is intended to provide a MEMS device to which wire bonding is easily applied when an electrode and a movable board are wired. The present invention is also intended to provide a manufacturing method in which dicing is performed without impairing a driving member and the like in the MEMS device and a MEMS module including the MEMS device.

SUMMARY

A micro electro mechanical systems (MEMS) device of the present invention includes a first substrate on which an electrode is formed, a movable substrate having at least a moving part and a periphery supporting member, a second substrate having a concave portion and a space including the concave portion is formed by jointing the first substrate, the movable substrate and the second substrate together. Also, the moving part inside the space moves when a voltage is applied between the electrode and the moving part through the periphery supporting member, and a part of the first substrate protrudes outside a side surface of the second substrate.

Since the part of the first substrate on which the electrode is formed protrudes outside the side surface of the second substrate that has the concave portion, the electrode is exposed in the protruding part of the first substrate. Thus, it becomes possible to perform wire bonding with a wire bonder.

In the MEMS device according to the present invention, a part of the electrode and the periphery supporting member may protrude outside the side surface of the second substrate. Since the part of the electrode protrudes outside the side surface of the second substrate, it becomes possible to perform wire bonding with a wire bonder. Also, the part of the periphery supporting member protrudes outside the side surface of the second substrate, thus it becomes possible to perform wire bonding with a wire bonder.

In the MEMS device according to the present invention, the electrode protrudes outside the side surface of the second substrate, and a part of the electrode may be formed to avoid overlapping the periphery supporting member that protrudes outside the side surface of the second substrate.

Since the electrode has the part which protrudes outside the side surface, and a part of the electrode does not overlap with the part of the periphery supporting member that protrudes outside the side surface, wire bonding can be performed to both the electrode and the periphery supporting member.

In the MEMS device according to the present invention, the electrode may be placed in a location other than in a light path when the light enters into the moving part.

If the electrode made of metal or the like is subjected to the light when the light enters into the moving part, reflection and a refractive index will change and is unfavorable. Thus, the electrode is not placed in the light path.

A method of manufacturing a MEMS device of the present invention includes a step of providing a first substrate on which an electrode, a movable substrate that has at least a moving part and a periphery supporting member and a second substrate that has a concave portion, a step of forming a space that includes a part of the concave portion by jointing the first substrate, the movable substrate and the second substrate together and a step of cutting a first member that is going to become the first substrate and a second member that is going to become the second substrate such that a part of the first substrate protrudes outside a side surface of the second substrate after the first member, a third member that is going to become the movable substrate and the second member are jointed. The moving part inside the space moves when a voltage is applied between the electrode and the moving part through the periphery supporting member.

By cutting a first member that is going to become the first substrate and a second member that is going to become the second substrate such that a part of the first substrate protrudes outside a side surface of the second substrate, the electrode is exposed in the part of the first substrate that protrudes outside the side surface of the second substrate. Therefore, it becomes possible to perform wire bonding with a wire bonder. Also, since cutting (dicing) is performed to hew out the MEMS device after the first member, the second member and the third member are jointed together. Therefore, the second substrate can work as a protective layer for the moving part and others, protecting them from running water that is used at the time of dicing.

The method of manufacturing a MEMS device according to the present invention may further include a step of forming the electrode and the periphery supporting member so as to have a part that protrudes outside the side surface of the second substrate.

Since the part of the electrode is formed to protrude outside the side surface of the second substrate, it becomes possible to perform wire bonding with a wire bonder. Also, the part of the periphery supporting member is formed to protrude outside the side surface of the second substrate, thus it becomes possible to perform wire bonding with a wire bonder.

The method of manufacturing a MEMS device according to the present invention may further include a step of forming the electrode that protrudes outside the side surface of the second substrate so as to have a part that is formed to avoid overlapping the periphery supporting member that protrudes outside the side surface of the second substrate.

Since the electrode is formed to have the part that does not overlap with the part of the periphery supporting member that protrudes outside the side surface, wire bonding can be performed to both the electrode and the periphery supporting member.

The method of manufacturing a MEMS device according to the present invention may further include a step of forming a joint board by jointing the member, the second member and the third member together, and a step of forming a space where the MEMS device is going to be formed so as to contain a part of the electrode and the periphery supporting member which protrude from the side surface of the second substrate in a case which a plurality of MEMS devices are hewn out from the joint board.

Since the joint board has the space where the MEMS device is going to be formed, and the space contains the electrode and the periphery supporting member that protrude from the side surface of the second substrate. Therefore, the electrode and the periphery supporting member are easily exposed by cutting the space with the dicing saw. As a consequence, it becomes easy to perform wire bonding.

The method of manufacturing a MEMS device according to the present invention may further include a step of forming a gap that is wider than a width of a blade used to cut the first member, on the electrode contained in the space, such that the blade can cut the first member without touching the electrode.

When the first member and the second member of the space are cut with a dicing saw, if the electrode is also cut with the dicing saw, conductive chips will be scattered and they can cause a short. Also, when the electrode is made of a metal such as gold, the metal will stick to the dicing saw. Therefore, a gap that is wider than the width of a blade (a dicing saw) used to cut the first member is formed on the electrode contained in the space, such that the blade can cut the first member without touching the electrode.

The method of manufacturing a MEMS device according to the present invention may further include a step of cutting the first member with a blade and a step of cutting the second member with another blade that has a different width from that of the blade used to cut the first member.

The dicing saw for cutting the second member has a relatively wide blade (a dicing saw) and another blade for cutting the first member has a narrower blade. Therefore, the MEMS device, including the part of the first substrate which protrudes outside of the side surface of the second substrate, is easily hewn out.

The method of manufacturing a MEMS device according to the present invention may further include a step of cutting the third member at the same time as cutting the first member and the second member.

Since the third member is cut at the same time as cutting the first member and the second member, the MEMS device is easily hewn out.

In the method of manufacturing a MEMS device according to the present invention, the electrode may be formed such that light can travel without being obstructed by the electrode when the light enters into the moving part.

If the electrode made of metal or the like is subjected to the light when the light enters into the moving part, reflection and a refractive index will be changed and is unfavorable. Thus, the electrode is formed such that light can travel without being obstructed by the electrode.

A MEMS module of the present invention includes any one of the MEMS devices described above.

Since the MEMS module has the above-described MEMS device, wiring by wire bonding is easily performed.

In the MEMS module according to the present invention, an opening through which light can enter into the moving part may be included.

Since the opening through which light can enter into the moving part is formed, it allows the light to enter. Also, if the opening is formed where the electrode is not formed, light can enter the moving part without reflecting and the like.

DETAILED DESCRIPTION

First Embodiment

Figure 1:
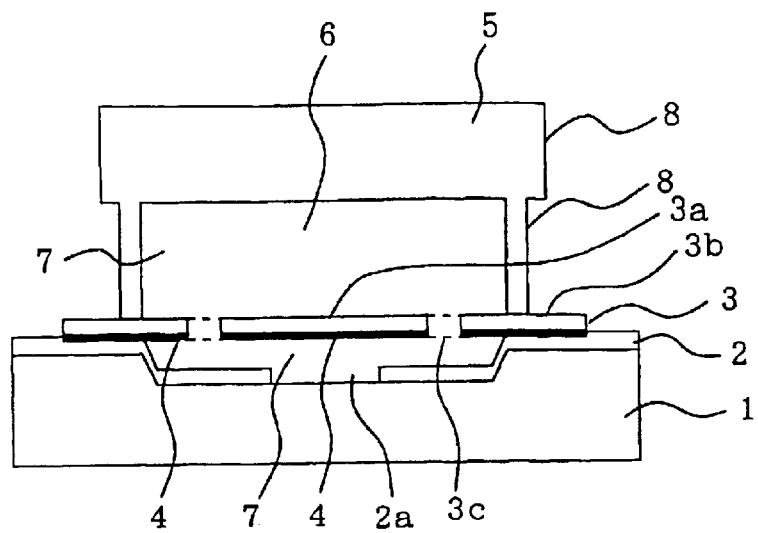
FIG. 1 is a longitudinal sectional view of a MEMS device according to a first embodiment of the present invention.

FIG. 1 is a longitudinal sectional view of a MEMS device according to a first embodiment of the present invention. In this first embodiment, a tunable light filter (also called as a Fabry-Perot filter) is given as an example of the MEMS device. The MEMS device shown in FIG. 1 includes a first substrate 1 made of borosilicate glass or the like and placed at the bottom. An electrode 2 made of gold, chromium alloy or the like is formed on the first substrate 1. At the center of the electrode 2, an opening 2a that is where the electrode is not formed is provided. A movable substrate 3 made of silicon or the like is attached to an upper side of the first substrate 1. The movable substrate 3 includes a moving part 3a, a periphery supporting member 3b and a hinge 3c. One or more hinges 3c couple the moving part 3a to the periphery supporting member 3b. The first substrate 1 and the movable substrate 3 are coupled where the periphery supporting member 3b is. An insulating film 4 is formed under the periphery supporting member 3b and the moving part 3a. A second substrate 5 made of borosilicate glass or the like is attached to an upper side of the periphery supporting member 3b of the movable substrate 3. A concave portion 6 is formed under the second substrate 5, and the concave portion 6 and a space under the movable substrate 3 together form a space 7. A side surface 8 is a periphery of the second substrate 5. In FIG. 1, an upper part of the side surface 8 protrudes outward and a step is formed. The second substrate 5 covers the whole of the space 7 so as to close off the space 7.

Figure 2:
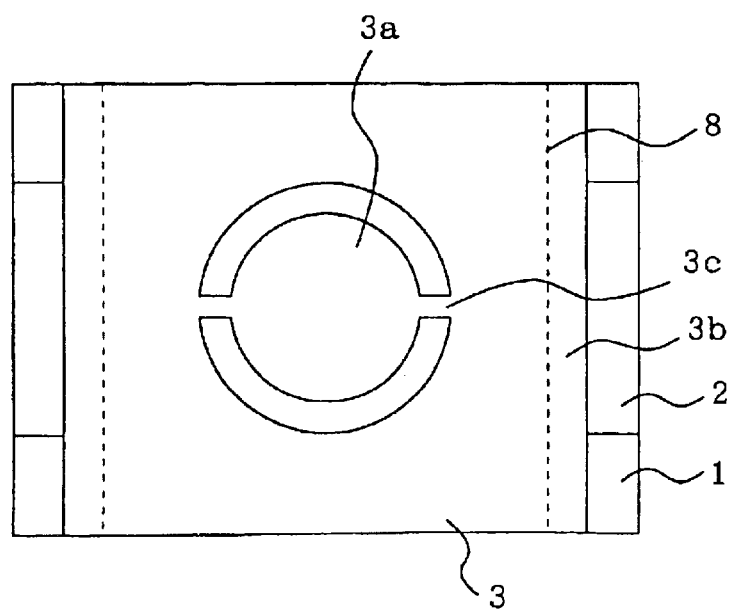
FIG. 2 is a top view of the MEMS device shown in FIG. 1.

FIG. 2 is a top view of the MEMS device shown in FIG. 1. A periphery of the side surface 8 of the second substrate 5 is shown with a dashed line in FIG. 2. In FIG. 2, a part of each side of the first substrate 1 protrudes outside the side surface 8 of the second substrate 5. A part of the electrode 2 and the periphery supporting member 3b also protrude outside the side surface 8 of the second substrate 5. Here, protruding outside the side surface 8 of the second substrate 5 means protruding out of the periphery of the side surface 8. There is a part where the electrode 2 that protrudes outside the side surface 8 of the second substrate 5 does not overlap the periphery supporting member 3b that protrudes outside the side surface 8, and each side of the electrode 2 protrudes in FIG. 2. The movable substrate 3 has holes around the moving part 3a, and the moving part 3a and the periphery supporting member 3b are coupled through the hinge 3c. Any number of hinges may be used although two hinges 3c are shown in FIG. 2.

Action of the MEMS device shown in FIG. 1 and FIG. 2 is described.

A voltage is applied between the electrode 2 and the moving part 3a. A voltage applied to the moving part 3a is provided through the periphery supporting member 3b and the hinge 3c. Therefore, an electrostatic charge is produced by the voltage applied between the electrode 2 and the moving part 3a, and the moving part 3a moves up and down. Light enters from a bottom of the first substrate 1, travels through the opening 2a of the electrode 2 and the moving part 3a and reaches the concave portion 6. Then, the light repeatedly reflects between an upper surface of the moving part 3a and a reflection film (not shown in figures) provided on a side of the concave portion 6 of the second substrate 5. During the light's reflection, light having a wavelength which does not meet an interference condition of a distance between two reflection films is rapidly attenuated, while only light having a wavelength which meets the interference condition remains. By emitting the light that meets the interference condition from an upper side of the second substrate 5, only light that has a specific wavelength is selected and can be transmitted.

A wavelength of the light that is transmitted can be selected depending on the displacement of the moving part 3a.

Figure 3:
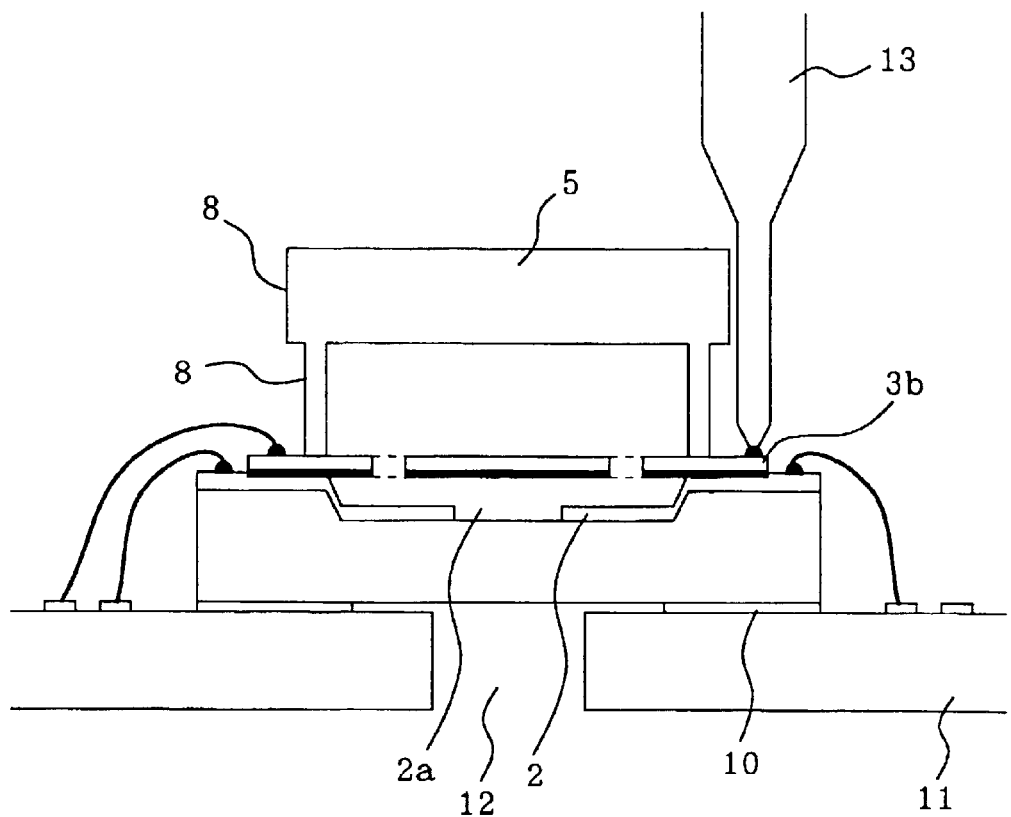
FIG. 3 is showing that the MEMS device is wired by wire bonding.

FIG. 3 shows that the MEMS device shown in FIG. 1 and FIG. 2 is wired by wire bonding. The MEMS device is coupled to a MEMS module 11 with an adhesive 10. The MEMS module 11 has an opening 12. The opening 12 is placed under the opening 2a of the electrode and has a slightly larger area than that of the opening 2a so that light can enter into the moving part 3a. After the MEMS device is coupled to such MEMS module, wiring is performed by wire bonding. The wire bonding is conducted so as to couple a part of the periphery supporting member 3b which protrudes outside the side surface 8 of the second substrate 5 onto an electrode provided on the MEMS module 11 with a wire. A wire bonder 13 is used to fix the wire to the part of the periphery supporting member 3b which protrudes outside the side surface 8. The wire bonder 13 is a machine that couples wires using ultrasonic wave and power voltage. The wire will not be attached unless the wire bonder 13 contacts with the periphery supporting member 3b from directly above it. However, since the periphery supporting member 3b has the part which protrudes outside the side surface 8 of the second substrate 5, a wire can be easily coupled onto it by the wire bonder 13 as shown in FIG. 3. A wire is also coupled to the electrode 2. The electrode 2 has the part which protrudes outside the side surface 8, and some portion of the protruding part does not overlap with the part of the periphery supporting member 3b which protrudes outside the side surface 8. Therefore, the wire can be easily coupled onto the protruding part of the electrode 2 by the wire bonder 13. It is preferable that the periphery supporting member 3b protrudes, for example, more than 5 $\mu$m from the side surface 8, and the electrode 2 protrudes, for example, more than 10 $\mu$m from the side surface 8.

According to the first embodiment of the present invention, the part of the first substrate 1 on which the electrode 2 is formed protrudes outside the side surface 8 of the second substrate 5 that has the concave portion 6, and the part of the electrode 2 and the periphery supporting member 3b also protrude outside the side surface 8 of the second substrate 5. Therefore, wire bonding is easily performed by the wire bonder 13. Further, since some portion of the protruding part of the electrode 2 does not overlap with the part of the periphery supporting member 3b which protrudes outside the side surface 8 of the second substrate 5, it is possible to perform wire bonding to both the electrode 2 and the periphery supporting member 3b.

In addition, because the electrode 2 has the opening 2a and the electrode 2 is not placed in a light path, a change of reflection or a refractive index does not occur. Also, light can enter into the moving part 3a since the MEMS module 11 has the opening 12.

In this first embodiment, though the tunable light filter is used as the MEMS devise, a structure of the MEMS devise according to the first embodiment of the present invention can be applied to other MEMS devices having the first substrate 1, the electrode 2, the movable substrate 3, the second substrate 5, the concave portion 6 and the like. For example, an Optical Add Drop Multiplexer (OADM) also has the movable substrate 3 shown in FIG. 2, and light switching is performed as the moving part 3a changes its direction with the hinge 3c as an axis.

In this first embodiment, though the electrode 2 is formed to cover an upper surface of the first substrate 1 and the electrode 2 has the opening 2a, the electrode 2 can be formed in a different way as long as it is placed under the moving part 3a and it does not overlap the light path. The insulating film 4 of the periphery supporting member 3b is not indispensable. If the insulating film 4 is not provided, contact between the electrode 2 and the periphery supporting member 3b should be avoided. A structure of the MEMS device is not limited to the one shown in FIG. 1 and FIG. 2, various changes and modifications can be applied as long as the structure includes the protruding part of the electrode 2, the periphery supporting member 3b which protrude outside the side surface of the second substrate and a part where these protruding parts do not overlap each other. The movable substrate 3 may include other components besides the moving part 3a, the periphery supporting member 3b and the hinge 3c, and these parts may be formed of either the same material or different materials. In the first embodiment, though the part of each side of the first substrate 1 protrudes outside the side surface 8 of the second substrate 5, and the part of each side of the electrode 2 and the periphery supporting member 3b also protrudes outside the side surface 8 of the second substrate 5, either one of the left side or right side of the part may protrude. Above-described modifications and applications can be applied to a MEMS device according to a second embodiment of the present invention described below and a MEMS device manufactured by a method according to a third embodiment of the present invention described later.

Second Embodiment

Figure 4:
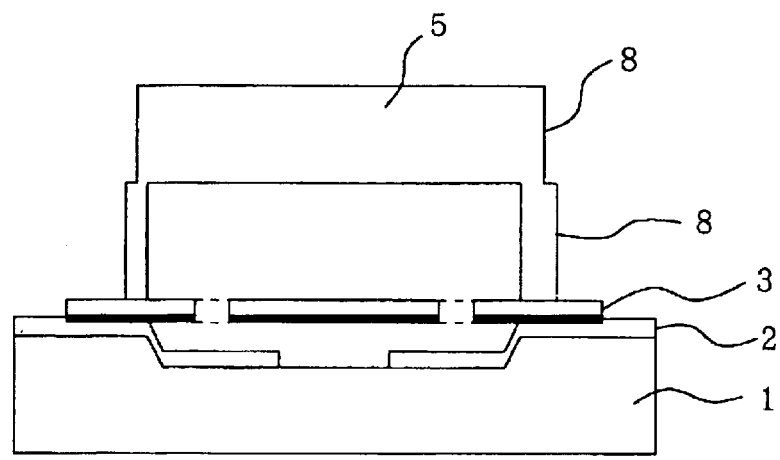
FIG. 4 is a longitudinal sectional view of a MEMS device according to the second embodiment of the present invention.

FIG. 4 is a longitudinal sectional view of a MEMS device according to the second embodiment of the present invention. The MEMS device shown in FIG. 4 has the same structures as those of the first embodiment except the shape of the side surface 8 of the second substrate 5. The same structures as those of the first embodiment are given identical reference numerals.

In the MEMS device shown in FIG. 4, a lower part of the side surface 8 of the second substrate 5 is formed to protrude outward as compared to the upper part of the side surface 8 and a step is formed. In FIG. 4, a part of the electrode 2 and the periphery supporting member 3b also protrude outside the side surface 8 of the second substrate 5. Here, protruding outside the side surface 8 of the second substrate 5 means protruding out of the periphery of the side surface 8. The side surface 8 may be flat, without having the step.

According to this second embodiment, since the lower part of the side surface 8 of the second substrate 5 protrudes outward as compared to the upper part of the side surface 8 and a step is formed, the area of the part of the periphery supporting member 3b which protrudes outside the side surface 8 can be larger than that of the first embodiment. Therefore, wire bonding with the wire bonder 13 can be preformed more easily as compared to when the wire bonding is performed to the MEMS device of the first embodiment.

Third Embodiment

FIG. 5 shows a step of a method for manufacturing a MEMS device according to a third embodiment of the present invention, more specifically, it shows a dicing (cutting) process. In FIG. 5, dicing is performed to the same MEMS device as that of the first embodiment shown in FIG. 1. The same structures as those of the first embodiment are given identical reference numerals.

Figure 5A:
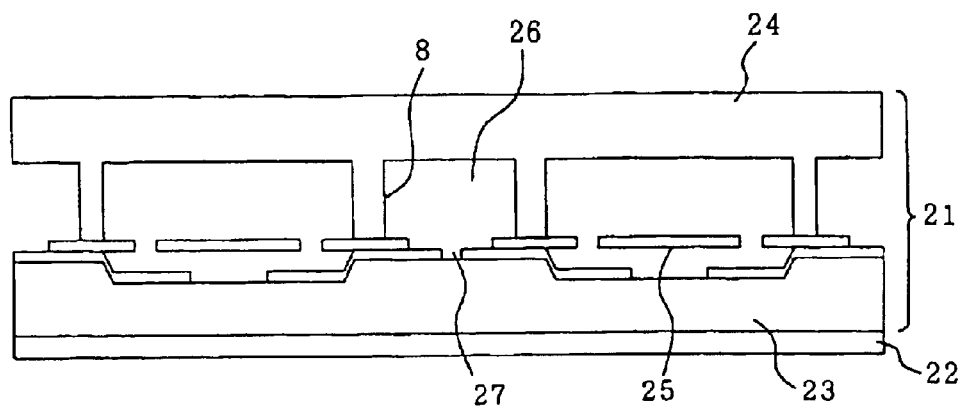
FIG. 5 is showing a step of a method for manufacturing a MEMS device according to a third embodiment of the present invention.

First, a joint board 21 and a dicing sheet 22 that adheres to the joint board 21 are provided (see FIG. 5(a)). The joint board 21 includes a first member 23 which is the first substrate, a second member 24 which is the second substrate 5, and a third member 25 which is the movable substrate 3. These three members are formed in certain shapes in advance and jointed together so as to compose the joint board 21. At the same time, the electrode 2 and others are formed. The joint board 21 has a space 26 where the MEMS device is going to be formed. In the space 26, the electrode 2 and the periphery supporting member 3b, which protrude from the side surface 8 of the second substrate 5, are contained. The electrode 2, which is contained in the space 26, has a gap 27 between an electrode 2 of one MEMS device and an electrode 2 of another MEMS device. In FIG. 5, though the third member 25 is divided into each MEMS device before they are jointed, the third member 25 may be jointed first, and then it may be cut together with the first member 23 and the second member 24. Although two MEMS devices are hewn out from single joint board 21 in FIG. 5, one or more than two MEMS devices may be hewn out by the same dicing method of the present embodiment.

Figure 5B:
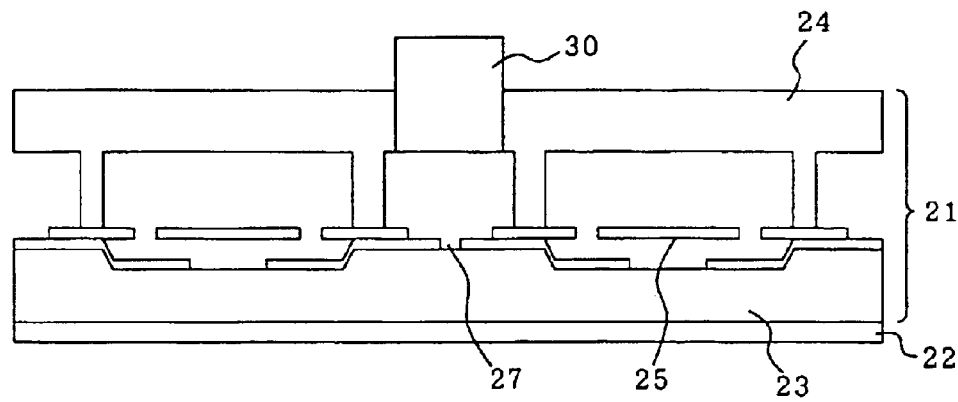

Next, around the center of the space 26 of the second member 24 is cut with a dicing saw 30 which includes a relatively wide blade (see FIG. 5(b)). At the same time, an edge of the second member 24 is cut, but the first member 23 should not be cut yet.

Then, a dicing saw 31 which has a narrower blade than that of the dicing saw 30 used to cut the second member 24, the first member 23, and the dicing sheet along the gap 27. The gap 27 should be wider than the blade of the dicing saw 31 and should be formed along a cutting line so that the dicing saw 31 (the blade) will not touch the electrode 2 when the first member 23 is cut. If it is necessary, an edge of the first member 23 is cut. As described above, the MEMS device is hewn out from the joint board 21, and the dicing sheet 22 is taken off at the end. Then the MEMS is completed.

Figure 5C:
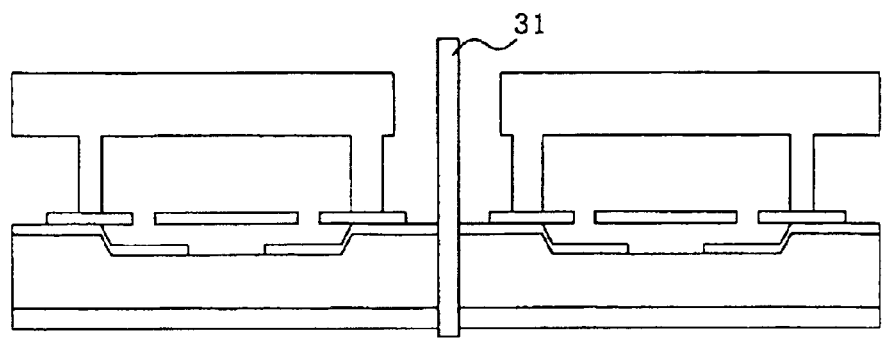

Such cutting processes as shown in FIG. 5(a) and FIG. 5(c) are performed to cut at least one direction. Regarding a cutting process in which cutting is performed in a parallel direction to the page of FIG. 5, for example, the joint board 21 and the dicing sheet 22 may be cut together with a narrow dicing saw. It is preferable that the width of the gap 27 is, for example, more than 2 $\mu$m in consideration of a commonly used dicing saw.

According to the third embodiment, dicing (cutting) is performed to hew out the MEMS device after the first member 23, the second member 24, and the third member 25 are jointed together. Therefore, the second member 24 can work as a protective layer for the moving part 3a and others, protecting from running water which is used at the time of dicing.

Also, the joint board 21 has the space 26 where the MEMS device is going to be formed and the space 26 contains the electrode 2 and the periphery supporting member 3b which protrude from the side surface 8 of the second substrate 5. Therefore, the electrode 2 and the periphery supporting member 3b are easily exposed by cutting the space 26 with the dicing saw. As a consequence, it becomes easy to perform wire bonding.

Further, the electrode 2 which is contained in the space 26 has a gap that is wider than the blade of the dicing saw 31, so that the dicing saw 31 will not touch when the first member 23 is cut with it. Therefore, chips will not be scattered which can prevent a short from happening, and metals will not stick to the dicing saw 31.

Also, the second member 24 is cut with the dicing saw 30 which has a relatively wide blade and the second member 24 is cut with the dicing saw 31 which has a narrower blade than that of the dicing saw 30. Therefore, the MEMS devices including the part of the first substrate which protrudes outside of the side surface of the second substrate 5 are easily hewn out.

If the second member 24 is cut in two stages with the narrow dicing saw, a MEMS device that has the same structures as those of the MEMS device shown in FIG. 5 can be hewn out. In a step shown in FIG. 5 (b), a MEMS device in which the side surface 8 is flat and has no steps or a MEMS device in which the lower part of the side surface 8 protrudes and the step is formed on the side surface 8 as shown in FIG. 4, can be hewn out depending on a width of the dicing saw 30.

Although the present invention has been fully described by way of an optical MEMS device, a method of manufacturing the same and the MEMS module, the present invention may be applied to non-optical MEMS device, a method of manufacturing the same and a MEMS module as long as they have an equivalent structure as those of the embodiments.

What is claimed is:

1. A micro electro mechanical systems (MEMS) device, comprising:
    a first substrate having an electrode thereon;
    a movable substrate having at least a moving part and a periphery supporting member; and
    a second substrate having a concave portion;
    wherein a space including the concave portion is formed by jointing the first substrate, the movable substrate and the second substrate together, the moving part inside the space moves when a voltage is applied between the electrode and the moving part through the periphery supporting member, and
    a part of the first substrate protrudes outside a side surface of the second substrate.

2. The MEMS device according to claim 1, wherein a part of the electrode and the periphery supporting member protrude outside the side surface of the second substrate.

3. The MEMS device according to claim 2, wherein the electrode protrudes outside the side surface of the second substrate, and a part of the electrode is laterally offset from the periphery supporting member that protrudes outside the side surface of the second substrate.

4. The MEMS device according to claim 1, wherein the electrode is located out of a light path when the light enters into the moving part.

5. A MEMS module comprising, the MEMS device according to claim 1.

6. The MEMS module according to claim 5, further comprising an opening through which light can enter into the moving part.

7. A method of manufacturing a MEMS device, comprising:
    providing:
        a first substrate on which an electrode is formed;
        a movable substrate that has at least a moving part and a periphery supporting member; and
        a second substrate that has a concave portion;
    forming a space that includes a part of the concave portion by jointing the first substrate, the movable substrate and the second substrate together;
    cutting a first member that is to become the first substrate and a second member that is to become the second substrate such that a part of the first substrate protrudes outside a side surface of the second substrate after the first member, a third member that is to become the movable substrate and the second member are jointed; and
    wherein the moving part inside the space moves when a voltage is applied between the electrode and the moving part through the periphery supporting member.

8. The method of manufacturing a MEMS device according to claim 7, further comprising:
    forming the electrode and the periphery supporting member so as to have a part that protrudes outside the side surface of the second substrate.

9. The method of manufacturing a MEMS device according to claim 8, further comprising:
    forming the electrode that protrudes outside the side surface of the second substrate so as to have a part that is formed laterally offset from the periphery supporting member that protrudes outside the side surface of the second substrate.

10. The method of manufacturing a MEMS device according to claim 8, further comprising:
    forming a joint board by jointing the first member, the second member and the third member together; and
    forming a space where the MEMS device is to be formed so as to contain a part of the electrode and the periphery supporting member which protrude from the side surface of the second substrate in a case which a plurality of MEMS devices are hewn out from the joint board.

11. The method of manufacturing a MEMS device according to claim 10, further comprising:
    forming a gap that is wider than a width of a blade used to cut the first member on the electrode contained in the space such that the blade may cut the first member without touching the electrode.

12. The method of manufacturing a MEMS device according to claim 7, further comprising:
    cutting the first member with a blade; and
    cutting the second member with another blade that has a different width from that of the blade used to cut the first member.

13. The method of manufacturing a MEMS device according to claim 7, further comprising:
    cutting the third member at the same time as cutting the first member and the second member.

14. The method of manufacturing a MEMS device according to claim 7, wherein the electrode is formed such that light can travel without being obstructed by the electrode when the light enters into the moving part.

15. A micro electro mechanical systems (MEMS) device, comprising:
    a first substrate including an electrode mounted thereon;
    a second substrate having a concave portion, a part of the first substrate protruding outside a side surface of the second substrate; and
    a third substrate having at least a moving part and a periphery supporting member, the first, second and third substrates being jointed together to form a space including the concave portion and the moving part;
    wherein the moving part moves when a voltage is applied between the electrode and the moving part through the periphery supporting member.

16. The MEMS device according to claim 15, wherein a part of the electrode and the periphery supporting member protrude outside the side surface of the second substrate.

17. The MEMS device according to claim 16, wherein a part of the electrode is laterally offset from the periphery supporting member.

18. The MEMS device according to claim 15, wherein the electrode is offset from a light path of light entering the moving part.

* * * * *